(12) United States Patent
McCune, Jr.

(10) Patent No.: US 8,395,402 B2
(45) Date of Patent: Mar. 12, 2013

(54) FREQUENCY EXTENSION METHODS AND APPARATUS FOR LOW-FREQUENCY ELECTRONIC INSTRUMENTATION

(76) Inventor: Earl W. McCune, Jr., Santa Clara, CA (US)

( * ) Notice: Subject to any disclaimer, the term of this patent is extended or adjusted under 35 U.S.C. 154(b) by 642 days.

(21) Appl. No.: 12/577,162

(22) Filed: Oct. 10, 2009

(65) Prior Publication Data
US 2011/0084703 A1    Apr. 14, 2011

(51) Int. Cl.
*G01R 31/3187* (2006.01)
(52) U.S. Cl. .................................. 324/750.3
(58) Field of Classification Search .... 324/76.11–76.23, 324/762.01–762.1, 620, 622, 603, 537; 257/48; 438/14–18
See application file for complete search history.

(56) References Cited

U.S. PATENT DOCUMENTS

| | | | | |
|---|---|---|---|---|
| 6,064,694 A | * | 5/2000 | Clark et al. | 375/224 |
| 6,411,252 B1 | * | 6/2002 | Grace | 342/174 |

* cited by examiner

*Primary Examiner* — Tung X Nguyen
(74) *Attorney, Agent, or Firm* — Patent Law Professionals, P.C.; William E. Winters (57) ABSTRACT

An electronic measuring system for extending the effective measurement input frequency range of an electronic measuring instrument includes an electronic measuring instrument and a frequency downconverting subsystem, separate from the electronic measuring instrument, having one or more cascaded (i.e., series-connected) downconverting frequency extending units (FEU-Ds). Each FEU-D of the frequency downconverting subsystem includes a downconverting circuit (e.g., a block downconverter) enclosed within a housing. The frequency downconverting subsystem operates to downconvert a test signal from a device under test (DUT) to a downconverted test signal having a frequency within the permissible input frequency range of the measuring instrument, thereby extending the effective measurement input frequency range of the electronic measuring instrument.

15 Claims, 12 Drawing Sheets

FREQUENCY EXTENSION METHODS AND APPARATUS FOR LOW-FREQUENCY ELECTRONIC INSTRUMENTATION

FIELD OF THE INVENTION

The present invention relates to electronic measuring instruments. More specifically, the present invention relates to methods and apparatus for extending the effective measurement frequency range of electronic measuring instruments.

BACKGROUND OF THE INVENTION

Electronic measuring instruments are used to collect information relating to the operation and performance of electrical and electronic circuits. Basic measuring instruments, such as ammeters and voltmeters, are used to measure currents and voltages of electrical signals in the circuit being analyzed (often referred to in the art as the "device under test" or "DUT"). These basic measuring instruments serve as building blocks for more complex electronic measuring instruments that are capable of measuring and providing information relating to the power, frequency, gain, attenuation, delay, etc. of test signals in the DUT.

Many types of electronic measuring instruments, for example, network analyzers, spectrum analyzers, and oscilloscopes, are designed to measure time-varying (e.g., alternating current (AC)) test signals. In general, these types of measuring instruments can provide accurate results only so long as the test signal being measured has a frequency within the permissible input frequency range of the measuring instrument. The permissible input frequency range of an electronic measuring instrument is, in general, determined and limited by the instrument's input frequency response. For most measuring instruments the input frequency response is flat only over a finite range of frequencies, typically ranging from a low measurement frequency limit close to zero hertz to an upper measurement frequency limit, beyond which the input frequency response begins to roll off.

To avoid errors and inaccuracies that can result from measuring test signals having frequencies beyond a measuring instrument's upper measurement frequency limit, a different (i.e., alternative) measuring instrument having a wider input frequency range must be used. Even when the frequency of the test signal is not higher than the upper measurement frequency limit, but is only near it, an alternative measuring instrument is usually used, since the dynamic range of a measuring instrument is usually best at lower frequencies.

Replacing a measuring instrument with an alternative measuring instrument is undesirable for a number of reasons. It is not only time-consuming, it can also be expensive, especially if the alternative measuring instrument is not readily available and must be purchased. The cost of acquiring an alternative measuring instrument can be particularly burdensome, given that measuring instruments with wider input frequency ranges tend to be more expensive than those having more restricted input frequency ranges. Replacing a measuring instrument with an alternative measuring instrument also undesirably shortens the useful lifespan of the measuring instrument being replaced, in some cases even rendering the measuring instrument being replaced obsolete.

SUMMARY OF THE INVENTION

An exemplary electronic measuring system for extending the effective measurement input frequency range of an electronic measuring instrument includes an electronic measuring instrument and a frequency downconverting subsystem, separate from the electronic measuring instrument, having one or more cascaded (i.e., series-connected) downconverting frequency extending units (FEU-Ds). Each FEU-D of the frequency downconverting subsystem includes a downconverting circuit (e.g., a block downconverter) enclosed within a housing. The frequency downconverting subsystem operates to downconvert a test signal from a device under test (DUT) to a downconverted test signal having a frequency within the permissible input frequency range of the measuring instrument, thereby extending the effective measurement input frequency range of the electronic measuring instrument.

An exemplary electronic measuring system that extends the effective output frequency range of a stimulus signal generator (such as may be included in an electronic measuring instrument, for example) is also disclosed. The system includes a stimulus signal generator and a frequency upconverting subsystem, separate from the stimulus signal generator, having one or more cascaded upconverting frequency extending units (FEU-Us). Similar to the FEU-Ds of the system for extending the effective measurement input frequency range of the electronic measuring instrument summarized above, each FEU-U of the system for extending the effective output frequency range of the stimulus signal generator summarized here includes an upconverting circuit (e.g., a block upconverter) enclosed within a housing. The frequency upconverting subsystem operates to upconvert a stimulus signal from the stimulus signal generator to an upconverted stimulus signal having a frequency sufficiently high to provide the stimulus to a DUT.

The features and properties of the system for extending the effective output frequency range of the stimulus signal generator may be combined with features and properties of the system for extending the effective measurement input frequency range of the electronic measuring instrument. According to one aspect of the invention, a plurality of FEU-Ds from which the one or more FEU-Ds of the frequency downconverting subsystem are selected and/or a plurality of FEU-Us from which the one or more FEU-Us of the frequency upconverting subsystem are selected is/are assembled in the form of a frequency extending kit made or adapted for use with the electronic measuring instrument, and packaged and sold separately from the electronic measuring instrument. Providing a plurality of FEU-Ds and/or FEU-Us in the frequency extending kit affords a person performing the measurements the ability to selectively adjust, set and control the frequencies of the test and stimulus signals with high precision and to within a range of frequencies best suited for the measurement being taken.

The frequency extending methods and apparatus of the present invention provide a number of advantages over prior art electronic measuring methods and apparatus. Importantly, they obviate the need to replace a low-frequency measuring instrument with a more advanced alternative measuring instrument, yet allow test signals having frequencies above the upper measurement frequency limit of the measuring instrument to still be measured. The frequency extending methods and apparatus of the present invention also avoid the time and costs associated with the acquiring or purchasing a more advanced alternative measuring instrument, and help to lengthen the effective life-span of a measuring instrument that would otherwise have to be replaced. Finally, the ability to cascade the FEU-Ds and/or FEU-Us provides the ability to selectively, flexibly, and accurately control the effective measurement input frequency range of the measuring instrument as well as the required or desired frequency of stimulus signals for a DUT.

Further features and advantages of the present invention, including descriptions of the structure and operation of the above-summarized and other exemplary embodiments of the invention, will now be described in detail with respect to accompanying drawings, in which like reference numbers are used to indicate identical or functionally similar elements.

DETAILED DESCRIPTION

Figure 1:
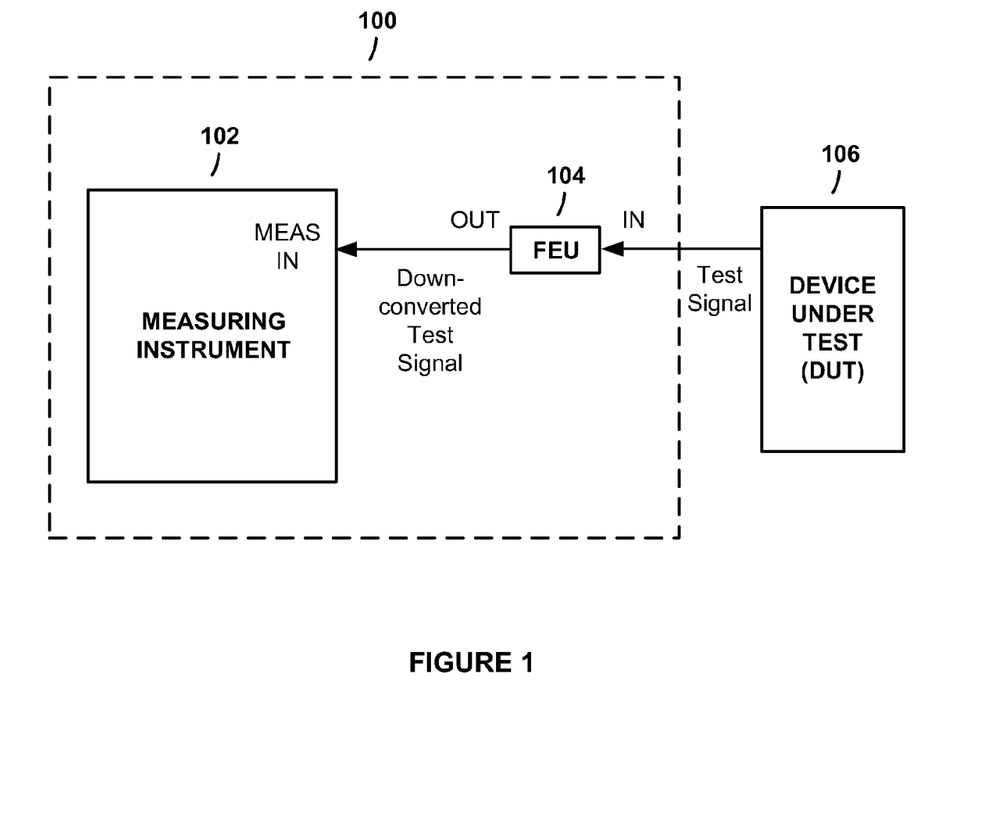
FIG. 1 is a drawing showing a frequency extending measuring system, according to an embodiment of the present invention.

Referring to FIG. 1, there is shown a frequency extending measuring system 100 for extending the effective measurement frequency range of an electronic measuring instrument, according to an embodiment of the present invention. The frequency extending measuring system 100 comprises an electronic measuring instrument 102 and a frequency extending unit (FEU) 104. The electronic measuring instrument 102 is configured to measure time-varying (e.g., alternating current (AC)) test signals from a device under test (DUT) 106. In the context of the present invention, the electronic measuring instrument 102 may comprise any type of measuring instrument having a limited or restricted measurement input frequency range, such as, for example, a network analyzer, a spectrum analyzer, or an oscilloscope.

Figure 2A:
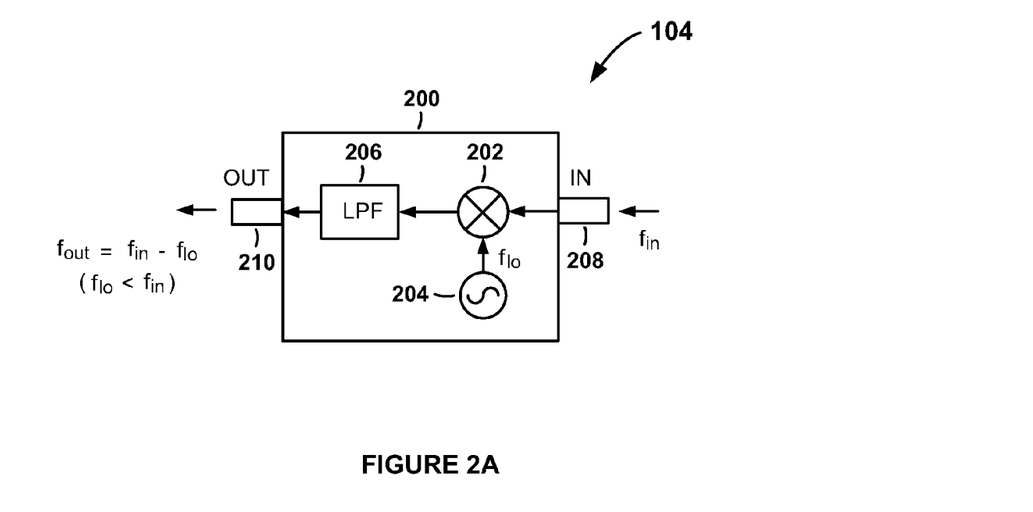
FIG. 2A is a drawing of the downconverting circuitry of the downconverting frequency extending unit (FEU-D) of the frequency extending measuring system in FIG. 1, according to an embodiment of the present invention.

The FEU 104 includes downconverting circuitry configured to downconvert a test signal from the DUT 106 to a downconverted test signal having a frequency within the permissible input frequency range of the measuring instrument 102, thereby extending the effective measurement frequency range of the measuring instrument 102 and allowing high-frequency test signals from the DUT 106 to be measured. The downconverting circuitry may be implemented in various ways. FIG. 2A is a drawing of one possible implementation in which the downconverting circuitry comprises a block downconverter including a mixer 202, local oscillator 204, and low-pass filter (LPF) 206. The mixer 202 is configured to receive a test signal from the DUT 106 at the input (IN) of the FEU 104, and generate an output signal that includes a frequency-sum ($f_{in}+f_{lo}$) mixing product and a frequency-difference ($f_{in}-f_{lo}$) mixing product, where $f_{lo}$ is the frequency of the local oscillator 204 and $f_{in}$ is the frequency of the test signal. The LPF 206 is configured to filter out the frequency-sum mixing product, to provide the desired downconverted test signal at the output (OUT) of the FEU 104.

Figure 2B:
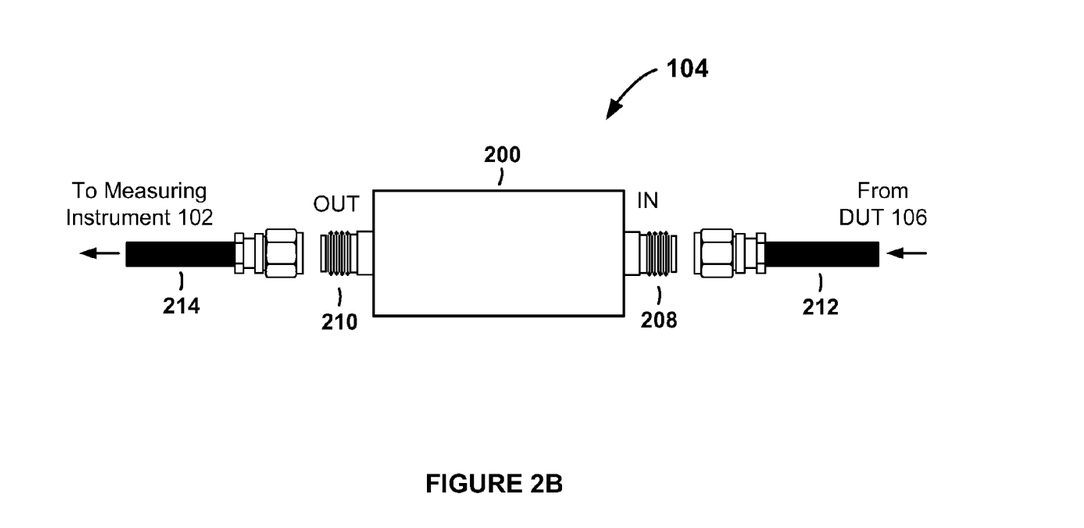
FIG. 2B is a drawing illustrating how the dowconverting circuitry of the downconverting FEU-D in FIG. 2A may be enclosed in a housing with input and output connectors, in accordance with an embodiment of the present invention.

According to one embodiment of the invention, illustrated in FIG. 2B, the downconverting circuitry of the FEU 104 is enclosed within a housing 200, and is powered by a direct current (DC) power supply inside the housing 200, or, alternatively, by a power source external to the housing 200. The housing 200 is made of a material (e.g., metal) that shields the downconverting circuitry inside the housing 200 from external electromagnetic radiation, and prevents electromagnetic radiation generated by the downconverting circuitry of the FEU 104 from substantially interfering with the measuring instrument 102 and other measuring apparatus external to the housing 200.

Input and output connectors 208 and 210 are configured in openings through walls of the housing 200, to provide electrical access to the downconverting circuitry within. In the exemplary embodiment shown in FIG. 2B, the input and output connectors 208 and 210 comprise coaxial-type connectors having center and outer conductors. Various types of coaxial connectors, including Bayonet Neill-Concelman (BNC), SubMiniature Version A, B or C (SMA, SMB or SMC)), Neill type (i.e., N-type), may be used, depending in part on the range of frequencies of the test signals being measured. The center conductors of the input and output connectors 208 and 210 are electrically coupled to the input and output, respectively, of the downconverting circuitry within the housing 200. The outer conductors are electrically coupled to the housing 200.

The input and output connectors 208 and 210 are further configured to connect to external cables 212 and 214 leading from the DUT 106 and to the test instrument 102. Specifically, when connected to the connectors of the coaxial cables 212 and 214, the center conductors of the input and output connectors 208 and 210 are electrically connected to the center conductors of the coaxial cables 212 and 214, and the outer conductors of the input and output connectors 208 and 210 are electrically connected to the outer conductors of the coaxial cables 212 and 214.

The frequency $f_{lo}$ of the local oscillator 204 determines the degree to which the measurement frequency range of the measuring instrument 102 is extended. For example, consider a measuring instrument 102 having an upper measurement frequency limit of 2 GHz and an FEU 104 having a local oscillator of frequency $f_{lo}$=5 GHz. Without the FEU 104, the measuring instrument 102 would not provide accurate measurement results for test signals having frequencies near and above the 2 GHz upper measurement frequency limit. However, when the FEU 104 is used, the effective upper measurement frequency limit of the measuring instrument 102 is extended to 2 GHz+5 GHz=7 GHz, thereby allowing test signals having frequencies higher than 2 GHz to be measured, despite the 2 GHz upper frequency limit of the measuring instrument.

In some measuring situations, the local oscillator frequency $f_{lo}$ may be too low to extend the effective measurement frequency range of the measuring instrument 102 to a frequency needed to make a reliable and accurate measurement. For example, consider a measuring instrument with an upper measurement frequency limit of 2 GHz, an FEU with a local oscillator frequency $f_{lo}$ equal to 4 GHz, and a test signal having a frequency $f_{in}$=7 GHz. The FEU would provide a downconverted test signal at the output OUT of the FEU of frequency $(f_{in}-f_{lo})$=(7−4) GHz=3 GHz, which is still beyond the 2 GHz upper measurement frequency limit of the measuring instrument. To overcome this limitation and provide better control and flexibility in extending the effective measurement frequency range of measuring instruments, a plurality of cascaded (i.e., series-connected) FEUs 104(1), . . . ,104(m−1), 104(m), where m is an integer greater than or equal to 1, may be used, as illustrated in the frequency extending measuring system 300 in FIG. 3. The FEUs of the plurality of FEUs 104(1), . . . ,104(m−1), 104(m) may have the same or different local oscillator frequencies, and may be selected or selectively combined in various ways to extend the effective measurement frequency range of the measuring instrument 102. As an example, consider a measuring instrument having an upper measurement frequency limit of 3 GHz and a test signal having a frequency of 37 GHz. First and second FEUs having local oscillator frequencies of 30 GHz and 5 GHz could be cascaded to extend the 2 GHz upper measurement frequency limit to an effective 38 GHz effective upper measurement frequency limit, and allow the 37 GHz test signal to be measured.

Figure 3:
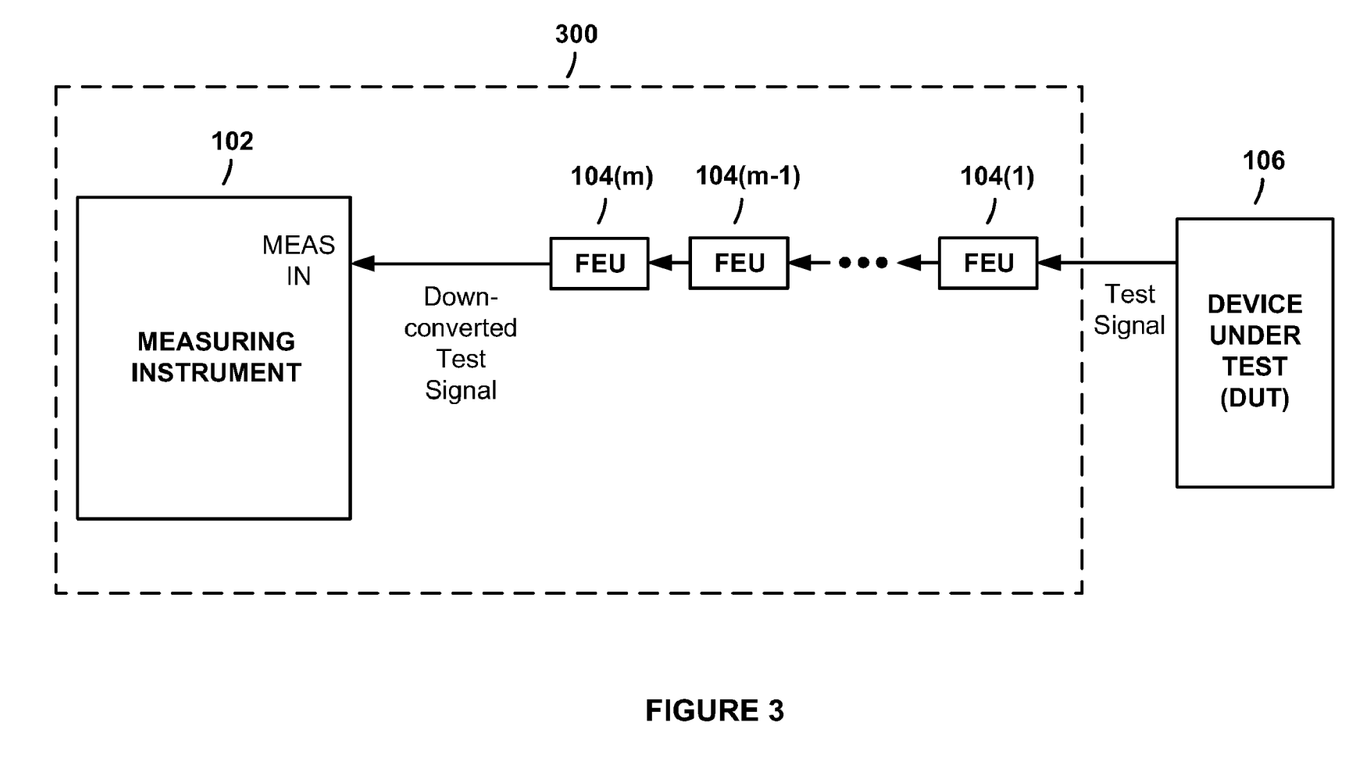
FIG. 3 is a drawing showing a frequency extending measuring system that includes a plurality of cascaded downconverting FEU-Ds, according to an embodiment of the present invention.

According to one embodiment of the invention, the plurality of FEUs 104(1), . . . ,104(m−1), 104(m) (and/or FEUs like the FEU 604 described below) comprises a frequency downconverting subsystem assembled in the form of a frequency extending kit, which is sold separately from the measuring instrument 102. In an alternative embodiment, the frequency downconverting subsystem and measuring instrument 102 are configured and sold together as a complete system.

Figure 4A:
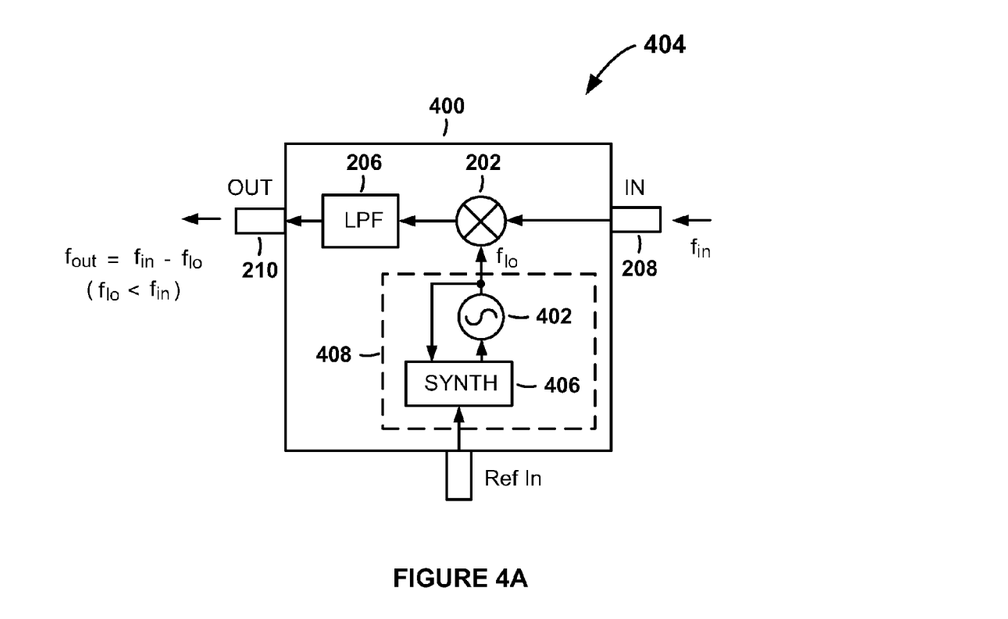
FIG. 4A is a drawing of an FEU-D, similar to the FEU-D in FIGS. 2A-B, but which includes a phase-locked loop for locking to a reference signal provided by a measuring instrument, in accordance with an embodiment of the present invention.

Some types of test signal measurements require phase coherency, i.e., an established and stable phase relationship between the test signal being measured and the measuring instrument 102. To accommodate these types of measurements, the FEU 104 in FIGS. 2A-B is modified to include a voltage controlled oscillator (VCO) 402 that is controlled by a frequency synthesizer 406 and configured within a phase-locked loop (PLL) 408 that locks onto a reference signal provided by the measuring instrument 102. An FEU 404 that has been modified to accommodate these types of phase coherent measurements is shown in FIG. 4A.

Figure 4B:
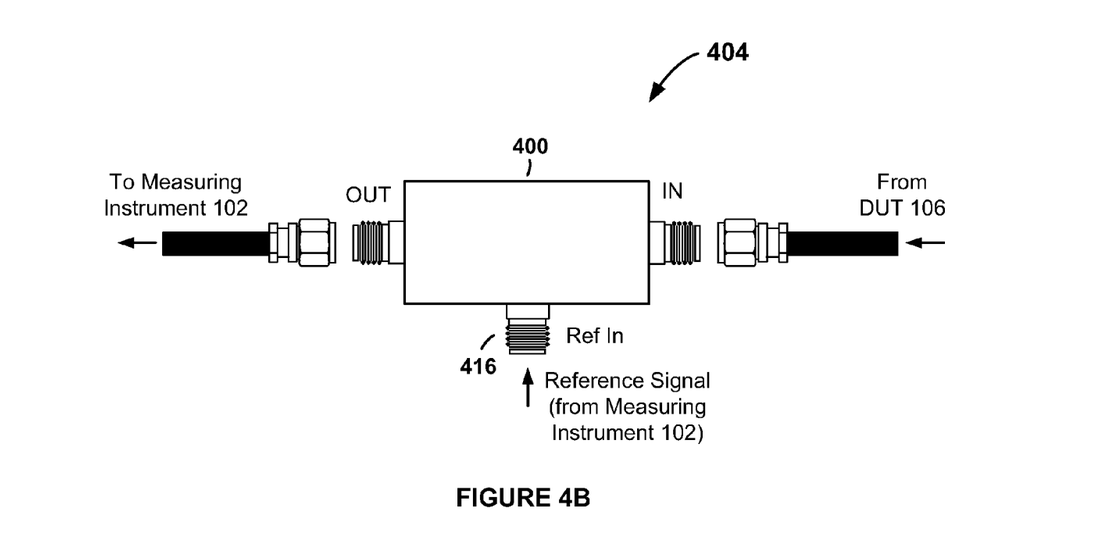
FIG. 4B is a drawing illustrating how the downconverting circuitry of the downconverting FEU-D in FIG. 4A may be enclosed in a housing with input, output and reference input connectors, in accordance with an embodiment of the present invention.
Figure 5:
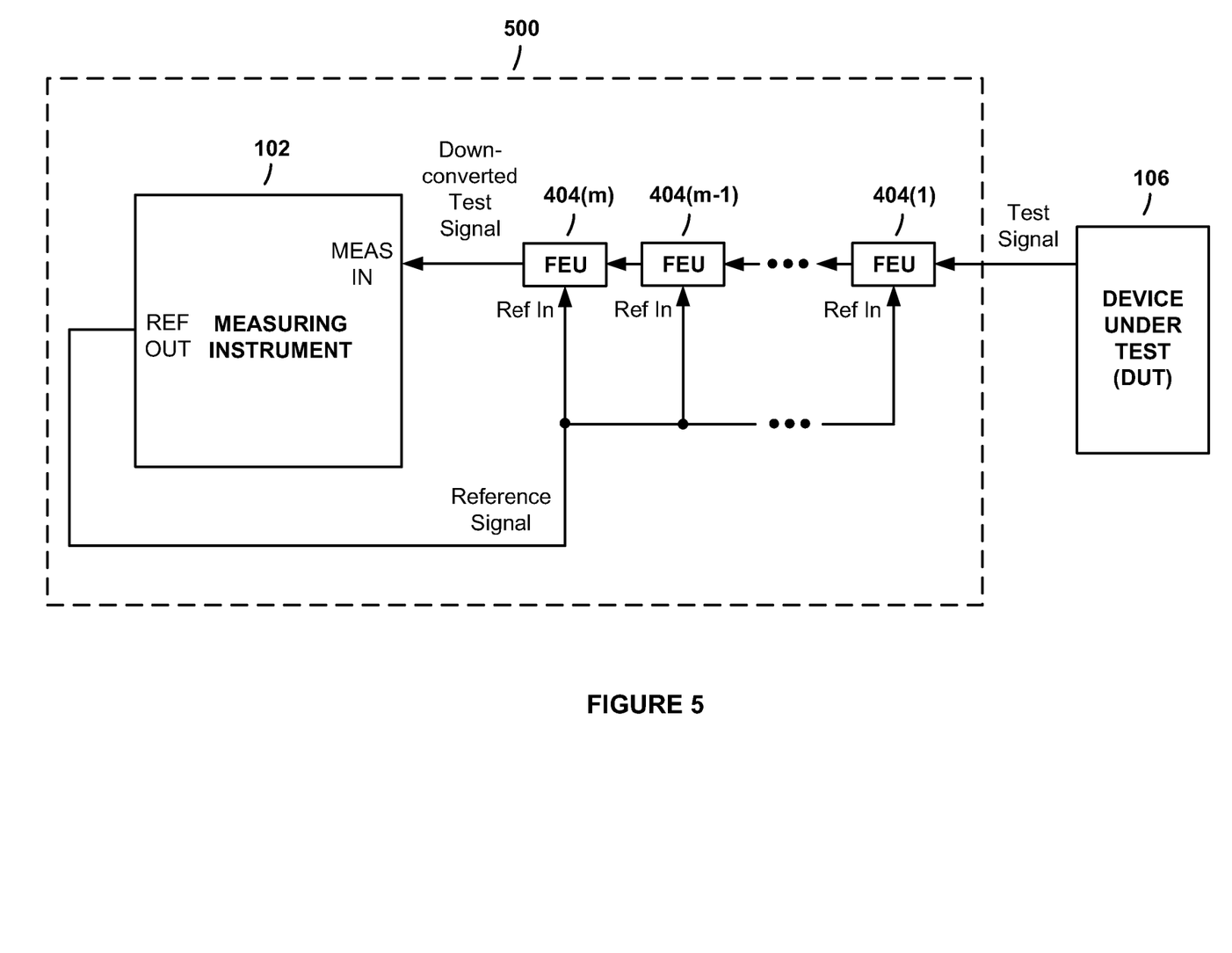
FIG. 5 is a drawing showing a phase-coherent frequency extending measuring system that includes a plurality of cascaded downconverting FEU-Ds, according to an embodiment of the present invention.

To provide access to the reference input of the PLL 408, the housing 400 of the FEU 404 is modified from that shown in FIG. 2B to include a reference input connector 416 for receiving the reference input signal from the measuring instrument, as illustrated in FIG. 4B. Like the input and output connectors 208 and 210 of the FEU 104 in FIG. 2B, the reference input connector 416 of the FEU 404 in FIG. 4B may comprise a coaxial-type connector (or other suitable connector type) and is configured to connect to a connector of a cable that connects to the reference signal output (REF OUT) of the measuring instrument 102. FIG. 5 illustrates a frequency extending measuring system 500 that includes a measuring instrument 102 and a plurality of cascaded FEUs 404(1), . . . ,404(m−1), 404(m), where each FEU has a reference input (Ref In) for receiving the reference signal from the measuring instrument 102.

Figure 6:
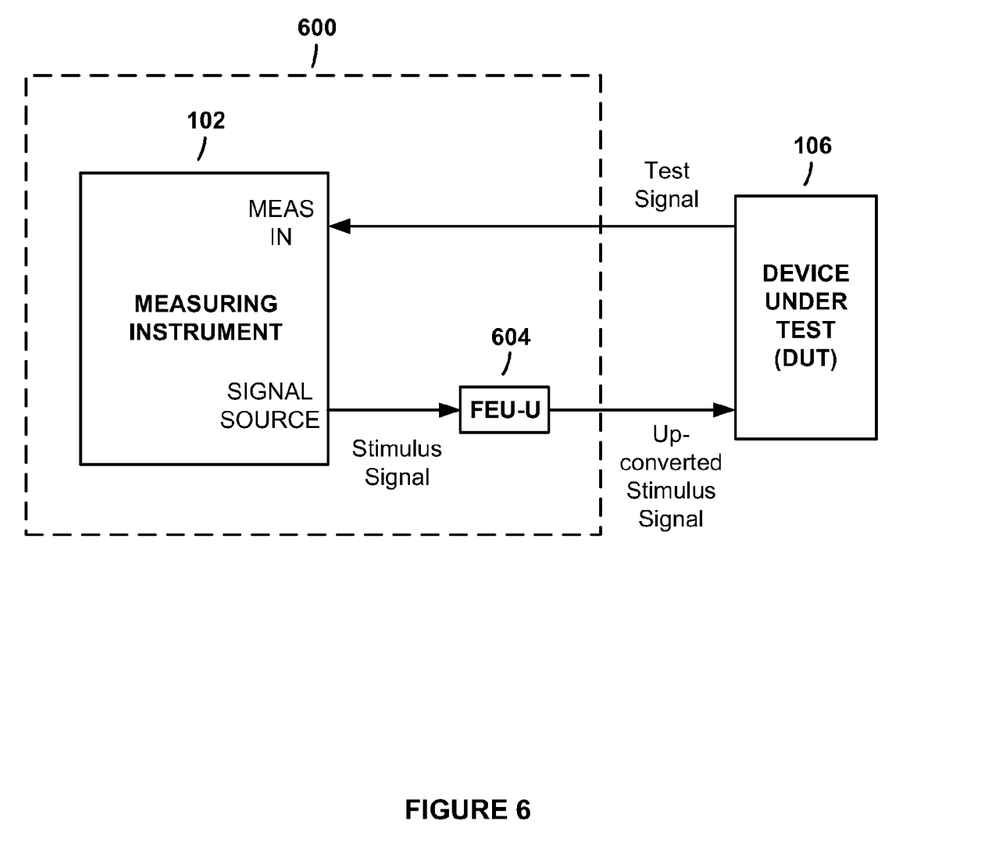
FIG. 6 is a drawing showing a frequency extending measuring system, according to an embodiment of the present invention.

Some other types of test signal measurements require that the DUT 106 be stimulated by a stimulus signal in order to produce the desired test signal to be measured. In a typical measuring system, the stimulus signal is generated and provided by a signal generator, which is often included within the measuring instrument 102. In some situations, the signal generator may not be capable of generating a stimulus signal of high enough frequency. To avoid having to replace or substitute the measuring instrument or signal generator for one that is capable of generating the necessary higher-frequency stimulus signal, according to one embodiment of the invention, an upconverting frequency extending unit FEU-U (where the trailing "U" in FEU-U is used to emphasize that the FEU is an upconverting FEU), which is separate and distinct from the measuring instrument 102, is used to extend the effective output frequency range of the signal generator. FIG. 6 is a drawing of a frequency extending measuring system 600 that includes such an upconverting FEU-U 604, illustrating how the upconverting FEU-U 604 is configured between the signal generator output (SIGNAL SOURCE) and the DUT 106.

Figure 7:
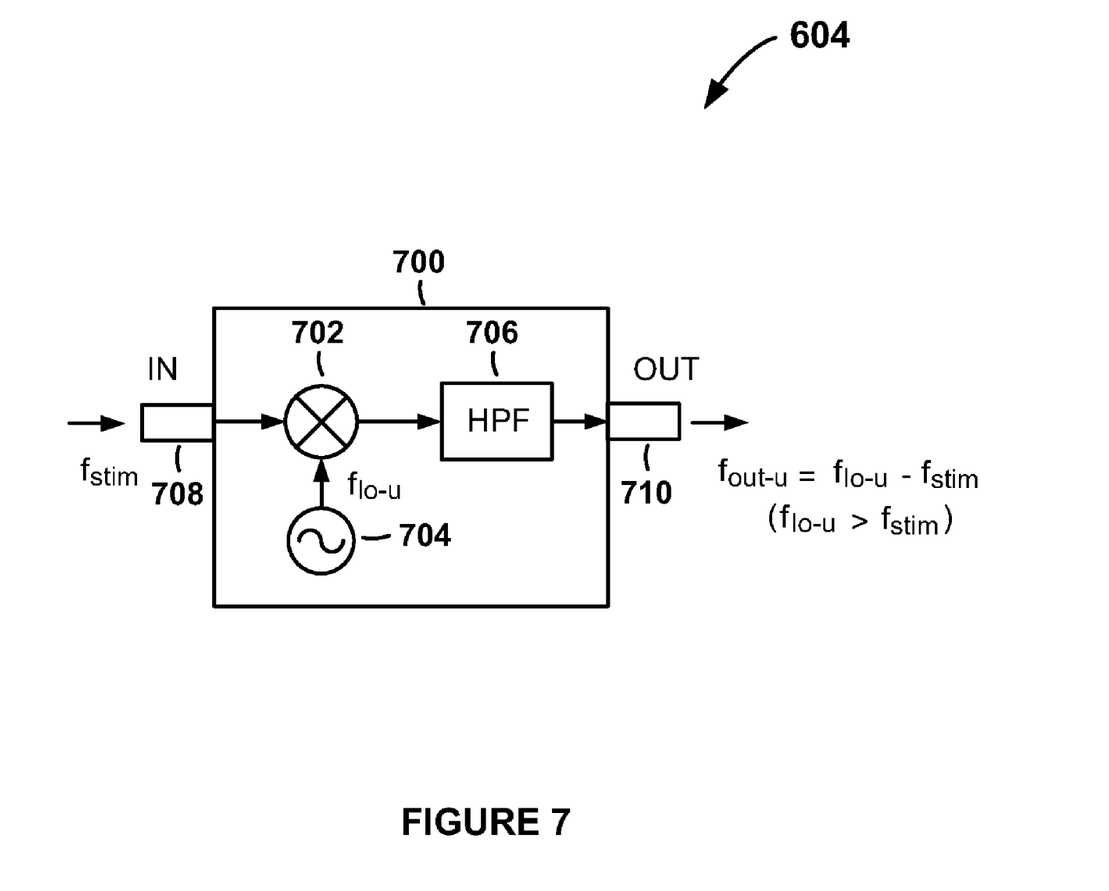
FIG. 7 is a drawing of the upconverting circuitry of the upconverting frequency extending unit (FEU-U) of the frequency extending measuring system in FIG. 6, according to an embodiment of the present invention.

The upconverting circuitry of the upconverting FEU-U 604 may be implemented in various ways. FIG. 7 is a drawing of one possible implementation, in which the upconverting circuitry comprises a block upconverter including a mixer 702, local oscillator 704, and high-pass filter (HPF) 706. The mixer 702 is configured to receive a stimulus signal from the output SIGNAL SOURCE of the signal generator of the measuring instrument 102, and generate an output signal that includes a frequency-sum $(f_{stim}+f_{lo-u})$ mixing product and a frequency-difference $(f_{stim}-f_{lo-u})$ mixing product, where $f_{lo-u}$ is the frequency of the local oscillator 704 and $f_{stim}$ is the frequency of the stimulus signal. The HPF 706 is configured to filter out the frequency-difference mixing product, to provide the desired upconverted stimulus signal for the stimulus input of the DUT 106.

As shown in FIG. 7, the upconverting FEU-U 604 is preferably enclosed in a housing 700 with openings in the housing walls for input and output connectors 708 and 710, similar to the downconverting FEU 104 in FIGS. 2A-B.

Figure 8:
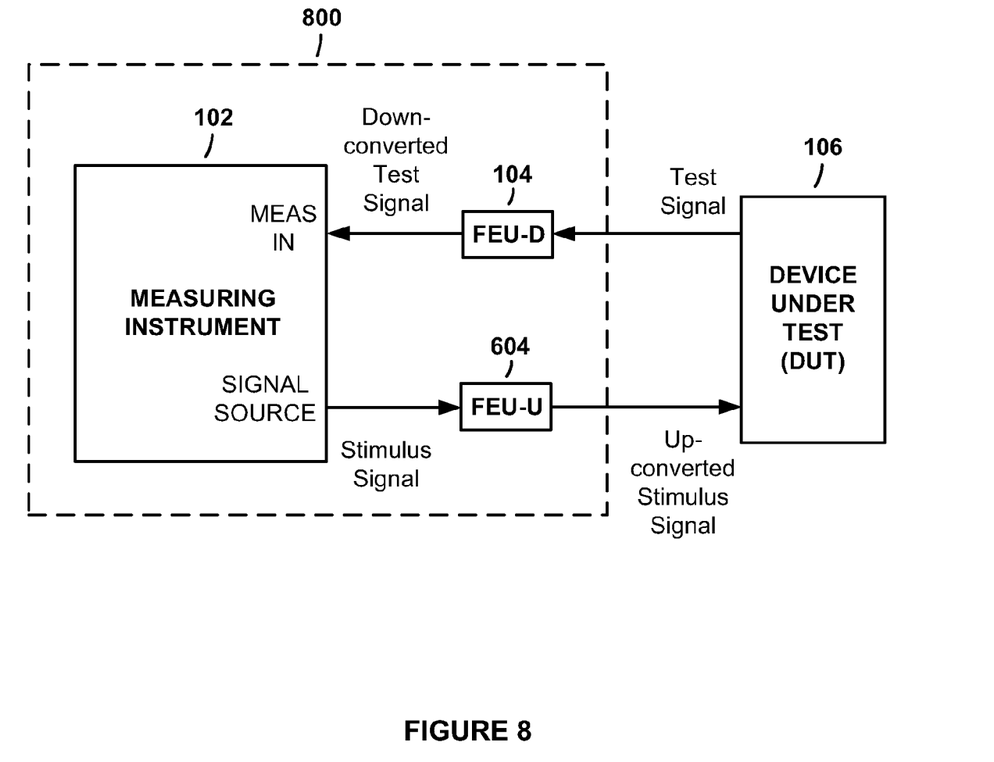
FIG. 8 is a drawing showing a frequency extending measuring system that employs both a dowconverting FEU-D and an upconverting FEU-U, according to an embodiment of the present invention.

For some types of test signal measurements it may be required to both generate an upconverted stimulus signal and a downconverted test signal. As illustrated in the frequency extending measuring system 800 FIG. 8, this may be accomplished by employing an upconverting FEU-U 604 (similar to the FEU-U 604 shown and described in FIG. 6) to upconvert the stimulus signal provide by the signal generator of the measuring instrument 102, and a downconverting FEU-D 104 (similar to the FEU 104 shown and described in FIGS. 2A-B) to downconvert the test signal from the DUT 106 (where the trailing "D" in FEU-D has been appended to emphasize that the FEU 104 is a downconverting FEU).

Figure 9:
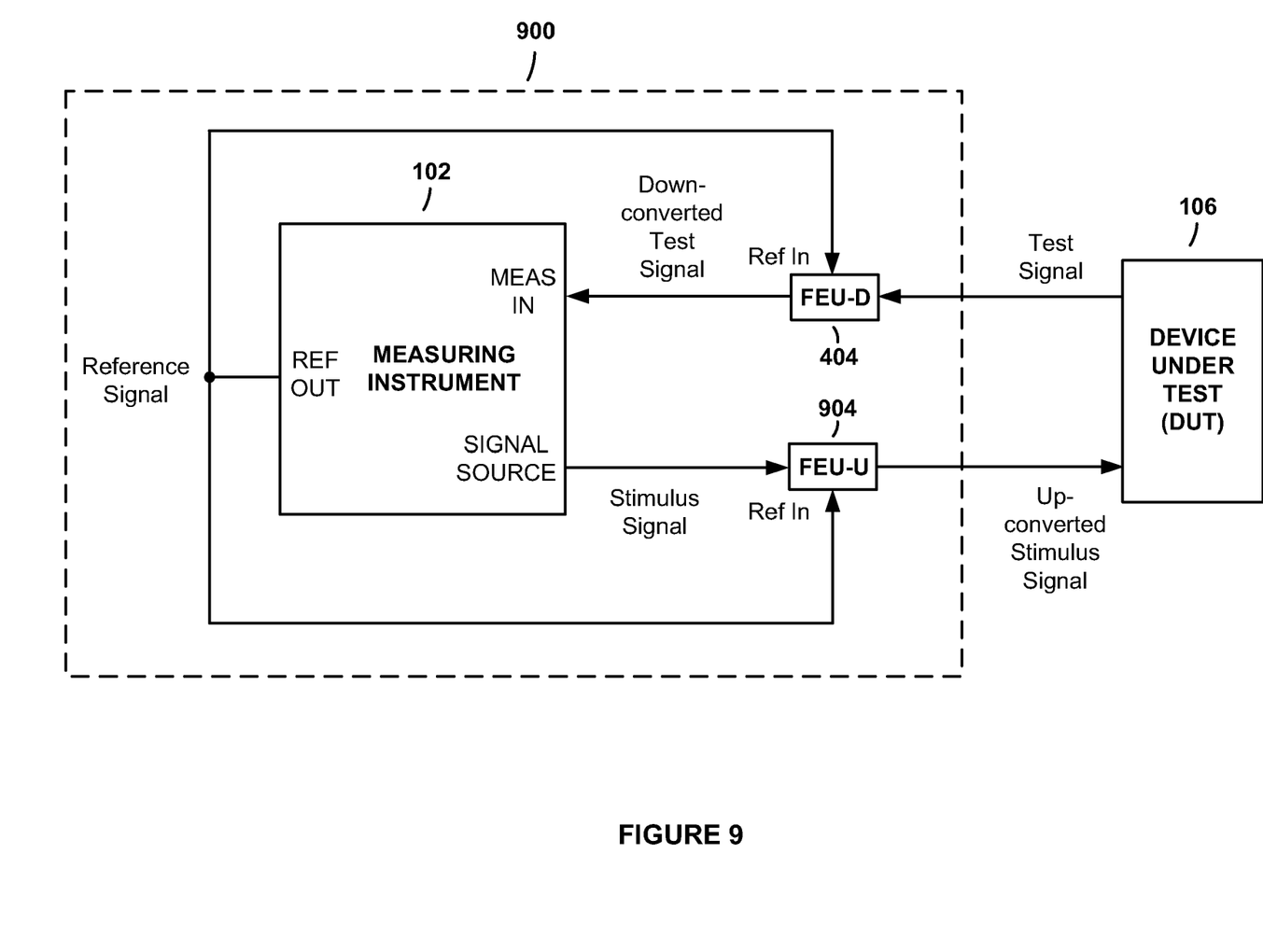
FIG. 9 is a drawing showing a phase-coherent frequency extending measuring system that employs both a dowconverting FEU-D and an upconverting FEU-U, according to an embodiment of the present invention.

For those types of test signal measurements requiring phase coherency, the upconverting FEU-U 604 in FIG. 7 is modified to include a PLL that locks onto a reference signal provided by the measuring instrument, similar to the downconverting FEU-D 404 in FIGS. 4A-B. A phase-coherent frequency extending measuring system 900, which includes an upconverting FEU-U 904 that has been modified in this manner, is shown in FIG. 9. Similar to the FEU-D 104 in FIGS. 2A-B, the FEU-U 904 is designed and configured to include an additional reference input connector for receiving the reference signal and routing the reference signal to the reference input of the PLL.

Figure 10:
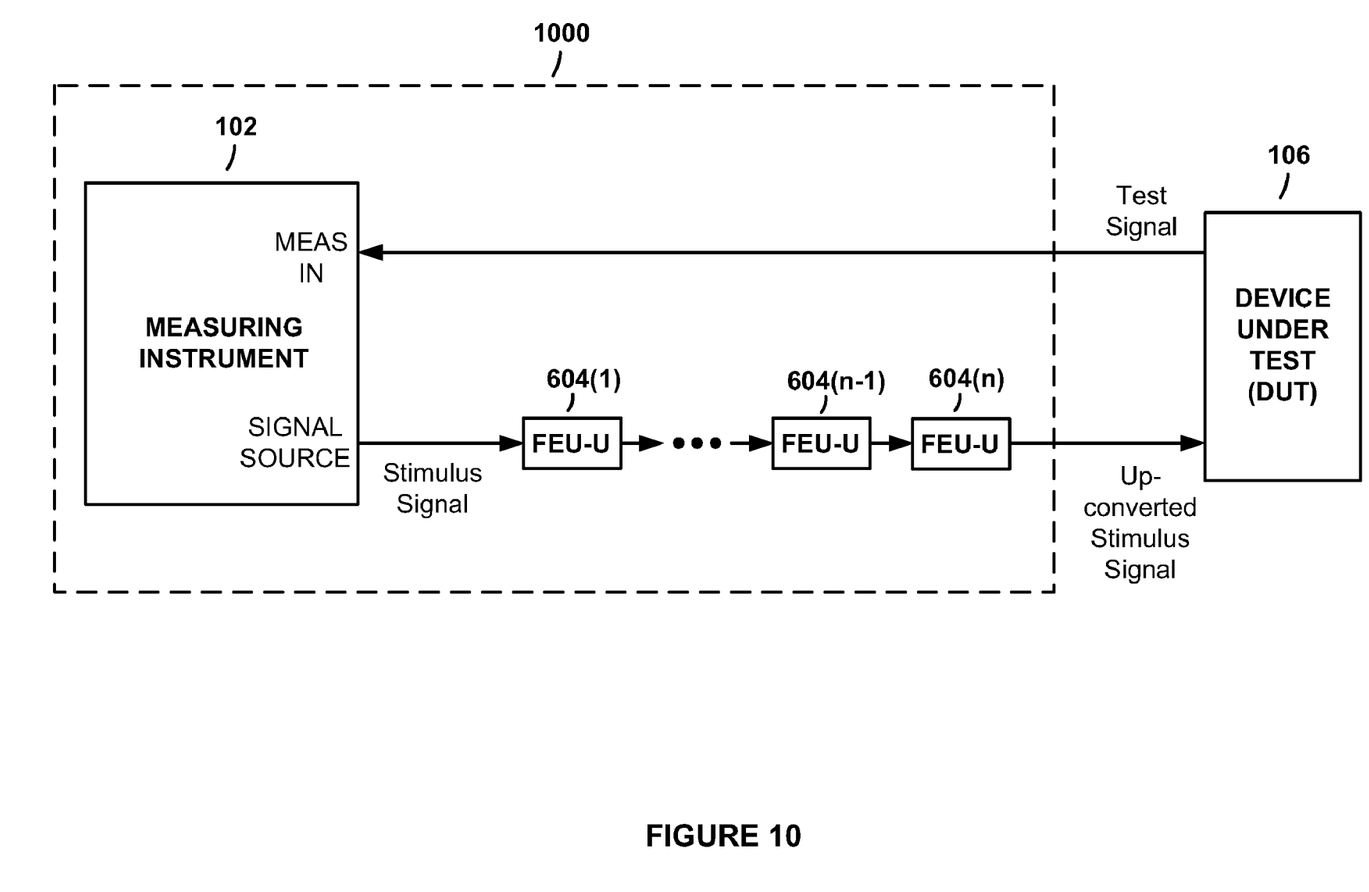
FIG. 10 is a drawing showing a frequency extending measuring system that includes a plurality of cascaded upconverting FEU-Us, according to an embodiment of the present invention.

Depending on the required frequency of the stimulus signal, a single upconverting FEU-U 604 may not be capable of extending the effective output frequency of the signal generator to the required frequency of the signal needed to stimulate the DUT 106. The local oscillator frequency $f_{lo-u}$ may simply be too low, or the frequency $f_{out-u}$ of the upconverted stimulus signal stimulus may not be accurate enough with use of the single upconverting FEU-U 604. To overcome this problem, and to provide better control and flexibility in setting the frequency $f_{stim}$ of the upconverted stimulus signal, a plurality of cascaded upconverting FEU-Us 604(1), . . . ,604(n–1), 604(n), where n is an integer greater than or equal to 1, may be used, as illustrated in the frequency extending measuring system 1000 shown in FIG. 10. The upconverting FEU-Us of the plurality of upconverting FEU-Us 604(1), . . . ,604(n–1), 604(n) may have the same or different local oscillator frequencies, and may be selectively combined in various ways to extend and control the frequency $f_{out-u}$ of the upconverted stimulus signal.

According to one embodiment, the plurality of upconverting FEU-Us 604(1), . . . ,604(n–1), 604(n) (and/or a plurality of FEU-Us 904 like the one described above) comprises a frequency upconverting subsystem assembled in the form of a frequency extending kit, which is sold separately from the measuring instrument 102. The frequency extending kit may further include a frequency downconverting subsystem, i.e., a plurality of downconverting FEUs 104(1), . . . ,104(m–1), 104(m) like the FEU 104 described above in FIGS. 2A-B and/or a plurality of downconverting FEU-Ds like the FEU-D 404 described above in FIGS. 4A-B. In an alternative embodiment, the measuring instrument 102 and the frequency upconverting subsystem (and also, possibly, the frequency downconverting subsystem) are assembled and sold together as a complete system.

Figure 11:
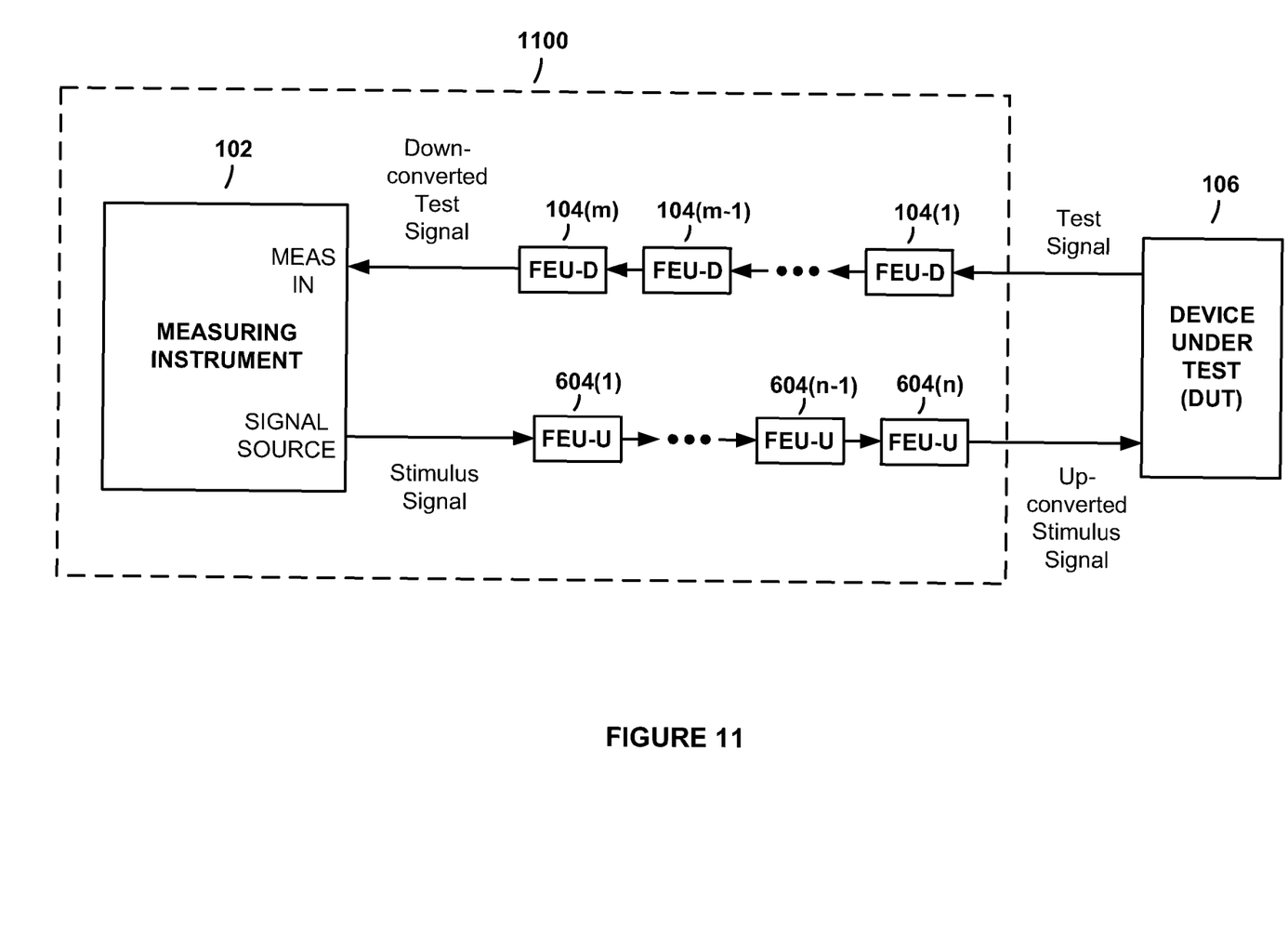
FIG. 11 is a drawing showing a frequency extending measuring system that employs both cascaded dowconverting FEU-Ds and cascaded upconverting FEU-Us, according to an embodiment of the present invention.
Figure 12:
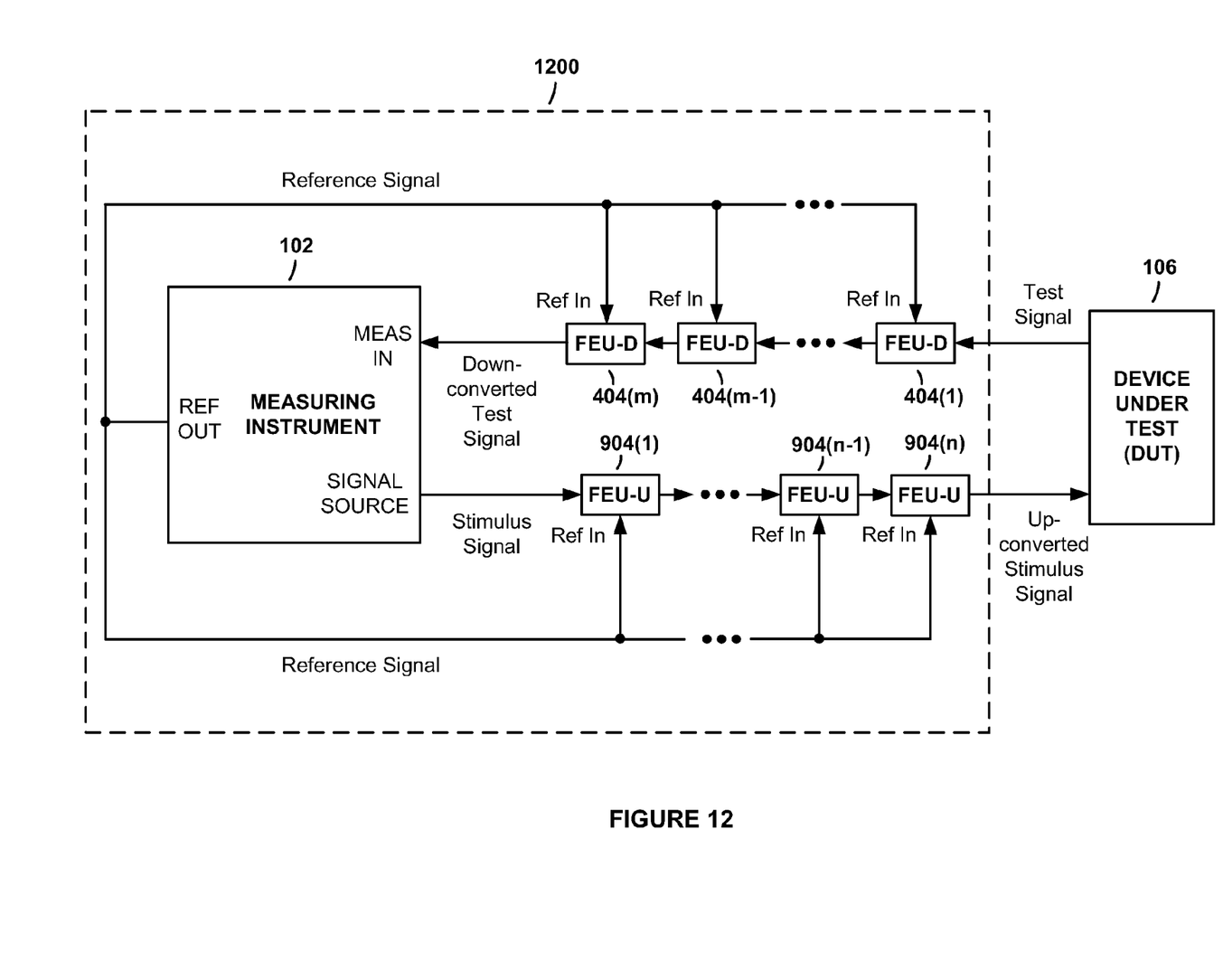
FIG. 12 is a drawing showing a phase-coherent frequency extending measuring system that employs both cascaded dowconverting FEU-Ds and cascaded upconverting FEU-Us, according to an embodiment of the present invention.

In some measuring environments, maximum flexibility and control over the frequency of the downconverted test signal and the frequency of the upconverted stimulus signal can be achieved by cascading both a plurality of dowconverting FEUs 104(1), . . . ,104(m–1), 104(m) and a plurality of upconverting FEU-Us 604(1), . . . ,604(n–1), 604(n). Such a frequency extending measuring system 1100 is illustrated in FIG. 11. If the test signal measurement requires phase coherency, the upconverting FEU-Us and downconverting FEU-Ds can be configured to include PLLs that lock to a reference signal, similar to as was explained above. FIG. 12 is a drawing of a frequency extending measuring system 1200, illustrating how a cascade of downconverting FEUs 404(1), . . . ,404(m–1), 404(m) and a cascade of upconverting FEU-Us 904(1), . . . ,904(n–1), 904(n) are configured to perform these types of phase-coherent measurements.

While various embodiments of the present invention have been described above, it should be understood that they have been presented by way of example, and not limitation. It will be apparent to persons skilled in the relevant art that various changes in form and detail may be made therein without departing from the spirit and scope of the invention. The scope of the invention should, therefore, be determined not with reference to the above description, but should instead be determined with reference to the appended claims, along with the full scope of equivalents to which such claims are entitled.

What is claimed is:

1. A method of providing selective frequency extension to low-frequency electronic instrumentation, comprising:
   selecting one or more downconverting frequency extending units (FEU-Ds) from a plurality of downconverting FEU-Ds made or adapted to be cascadable between a signal output of a device under test (DUT) and a measuring input of an electronic measuring instrument; and
   coupling the selected one or more downconverting FEU-Ds between a signal output of a DUT and a measuring input of an electronic measuring instrument, to downconvert a signal from the DUT to a downconverted signal having a frequency within an input frequency range of said electronic measuring instrument.

2. The method of claim 1 wherein selecting the one or more downconverting FEU-Ds from said plurality of downconverting FEU-Ds and coupling said selected one or more downconverting FEU-Ds between the signal output of the DUT and the measuring input of the electronic measuring instrument comprises:
   selecting a plurality of downconverting FEU-Ds from said plurality of downconverting FEU-Ds;
   cascading the selected plurality of downconverting FEU-Ds; and
   coupling the cascaded plurality of downconverting FEU-Ds between the signal output of the DUT and the measuring input of said electronic measuring instrument.

3. The method of claim 2 wherein said plurality of downconverting FEU-Ds comprises a kit made or adapted for use with said electronic measuring instrument.

4. The method of claim 1, further comprising selecting one or more upconverting frequency extending units (FEU-Us) from a plurality of upconverting FEU-Us made or adapted to be cascadable between an output of a signal generator and a signal input of said DUT;
   coupling the selected one or more upconverting FEU-Us between an output of a signal generator and a signal input of a DUT, to upconvert a signal from said signal generator to an upconverted signal for said DUT.

5. The method of claim 4 wherein selecting the one or more upconverting FEU-Us from said plurality of upconverting FEU-Us and coupling said selected one or more upconverting FEU-Us between the output of the signal generator and the signal input of the DUT comprises:
   selecting a plurality of upconverting FEU-Us from said plurality of upconverting FEU-Us;
   cascading the selected plurality of upconverting FEU-Us; and
   coupling the cascaded plurality of upconverting FEU-Us between the output of the signal generator and the signal input of said DUT.

6. The method of claim 5 wherein said plurality of downconverting FEU-Ds and said plurality of upconverting FEU- Us collectively comprise a frequency extending kit made or adapted for use with said electronic measuring instrument and/or said signal generator.

7. The method of claim 1 wherein each downconverting FEU-D of said plurality of downconverting FEU-Ds includes a local oscillator (LO) having an LO frequency different from one or more downconverting FEU-Ds of said plurality of downconverting FEU-Ds.

8. The method of claim 1 wherein each downconverting FEU-D of said plurality of downconverting FEU-Ds has its own unique and separate housing.

9. The method of claim 1 wherein each downconverting FEU-D of said plurality of downconverting FEU-Ds includes connectors that allow the downconverting FEU-Ds to be physically and electrically cascaded.

10. A method of providing selective frequency extension to low-frequency electronic instrumentation, comprising:
    selecting one or more upconverting frequency extending units (FEU-Us) from a plurality of upconverting FEU-Us made or adapted to be cascadable between a signal output of a signal generator and a signal input of a device under test (DUT); and
    coupling the selected one or more upconverting FEU-Us between a signal output of a signal generator and a signal input of said DUT.

11. The method of claim 10 wherein selecting the one or more upconverting FEU-Us from said plurality of upconverting FEU-Us and coupling said selected one or more upconverting FEU-Us between the signal output of the signal generator and the signal input of said DUT comprises:
    selecting a plurality of upconverting FEU-Us from said plurality of upconverting FEU-Us;
    cascading the selected plurality of upconverting FEU-Us; and
    coupling the cascaded plurality of upconverting FEU-Us between the signal output of said signal generator and the signal input of said DUT.

12. The method of claim 10 wherein said plurality of upconverting FEU-Us comprises a kit made or adapted for use with said signal generator.

13. The method of claim 10 wherein each upconverting FEU-U of said plurality of upconverting FEU-Us includes a local oscillator (LO) having a LO frequency different from one or more upconverting FEU-Us of said plurality of upconverting FEU-Us.

14. The method of claim 10 wherein each upconverting FEU-U of said plurality of upconverting FEU-Us has its own unique and separate housing.

15. The method of claim 10 wherein each upconverting FEU-U of said plurality of upconverting FEU-Us includes connectors that allow the upconverting FEU-Us to be physically and electrically cascaded.

* * * * *